United States Patent
Choi

(10) Patent No.: US 10,858,533 B2
(45) Date of Patent: Dec. 8, 2020

(54) ANTI-REFLECTIVE HARDMASK COMPOSITION

(71) Applicants: Sang Jun Choi, Suwon-si (KR); OLAS CO., LTD., Cheonan-si (KR)

(72) Inventor: Sang Jun Choi, Seoul (KR)

(73) Assignees: Sang Jun Choi, Suwon-si (KR); OLAS CO., LTD., Cheonan-si (KR)

(*) Notice: Subject to any disclaimer, the term of this patent is extended or adjusted under 35 U.S.C. 154(b) by 0 days.

(21) Appl. No.: 16/379,948

(22) Filed: Apr. 10, 2019

(65) Prior Publication Data
US 2019/0309183 A1   Oct. 10, 2019

(30) Foreign Application Priority Data
Apr. 10, 2018 (KR) .................. 10-2018-0041657

(51) Int. Cl.
*C09D 161/34* (2006.01)
*H01L 21/027* (2006.01)

(52) U.S. Cl.
CPC ........ *C09D 161/34* (2013.01); *H01L 21/0276* (2013.01)

(58) Field of Classification Search
CPC .................................................... C09D 161/34
See application file for complete search history.

(56) References Cited

U.S. PATENT DOCUMENTS

| | | | | |
|---|---|---|---|---|
| 8,674,052 B2 * | 3/2014 | Saito | .................. | C08G 12/26 528/117 |
| 10,189,947 B2 * | 1/2019 | Choi | .................. | C08G 16/0268 |

FOREIGN PATENT DOCUMENTS

| JP | 2014029435 | 2/2014 |
|---|---|---|
| KR | 101572594 | 11/2015 |
| KR | 1020170083859 | 7/2017 |
| WO | 2017188263 | 11/2017 |

OTHER PUBLICATIONS

Machine translation of KR 101572594 B1, published Nov. 27, 2015.*

* cited by examiner

*Primary Examiner* — Vickey Nerangis
(74) *Attorney, Agent, or Firm* — Lex IP Meister, PLLC

(57) ABSTRACT

An anti-reflective hardmask composition contains: (a) an arylcarbazole derivative polymer represented by the following Chemical Formula 1 or a polymer blend containing the same; and (b) an organic solvent

[Chemical Formula 1]

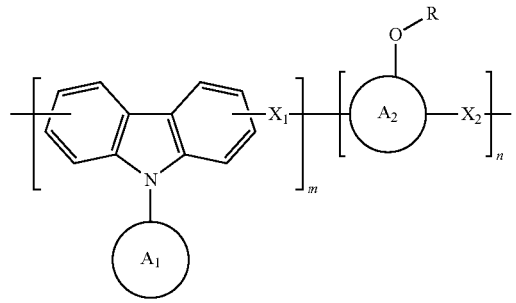

in Chemical Formula 1, $A_1$ and $A_2$ are each independently a ($C_6$-$C_{40}$) aromatic aryl group and are the same as or different from each other,
R is t-butyloxycarbonyl (t-BOC), ethoxyethyl, isopropyloxyethyl, or tetrahydropyranyl,
$X_1$ and $X_2$ are each a polymerization linkage group derived from aldehyde or an aldehyde acetal monomer capable of being one-to-one polymerized with an arylcarbazole derivative and $A_2$ in the presence of an acid catalyst,
m/(m+n) is in a range of 0.05 to 0.8, and
a weight average molecular weight (Mw) of an the polymer is in a range of 1,000 to 30,000.

14 Claims, No Drawings

ANTI-REFLECTIVE HARDMASK COMPOSITION

CROSS-REFERENCE TO RELATED APPLICATION

This application claims priority to and the benefit of Korean Patent Application No. 10-2018-0041657 filed in the Korean Intellectual Property Office on Apr. 10, 2018, the entire contents of which are incorporated herein by reference.

BACKGROUND OF THE INVENTION

(a) Field of the Invention

The present invention relates to a hardmask composition having an anti-reflective coating property available for a lithographic process. More particularly, the present invention relates to a polymer containing an arylcarbazol based aromatic ring having a high absorption property in a UV region and a hardmask composition containing the same.

(b) Description of the Related Art

Recently, refining processes have been gradually required in a semiconductor industry, and an effective lithographic process is essentially required to realize these ultra-refining techniques.

Particularly, there is an increasing demand for a novel material capable of being applied to a hardmask process, which is essential in an etching process. Generally, a hardmask film serves as an intermediate film for transferring a fine pattern of a photoresist to a lower substrate layer through a selective etching process. Therefore, a hardmask layer is required to have properties such as chemical resistance, heat resistance, etching resistance, and the like so as to withstand multiple etching processes. An amorphous carbon layer (ACL) film formed by a chemical vapor deposition (CVD) method has been used as one of conventional hardmask films. However, it is quite inconvenient to use the conventional hardmask layer due to its disadvantages, such as a need for investment in high-cost equipment, particles formed during a process, or a problem arising in photo-alignment caused by an optically opaque film. Recently, a spin-on hardmask formed by a spin-on coating method has been introduced instead of the chemical vapor deposition method as described above. In the spin-on coating method, a hardmask composition is formed using an organic polymer material having solubility in a solvent. Here, it is most important to form an organic polymer coating film simultaneously having etching resistance. However, since solubility and etching resistance which are two properties required in such an organic hardmask layer are in a conflict relation, a hardmask composition capable of satisfying these properties has been required.

Recently, materials capable of being applied to a semiconductor lithographic process while satisfying properties of the organic hardmask material as described above have been introduced (Korean Patent Laid-Open Publication No. 10-2009-0120827, Korean Patent Laid-Open Publication No. 10-2008-0107210, and WO 2013100365 A1). These materials are hardmask materials synthesized using copolymers having suitable polymer molecular weights by conventional phenol resin preparation methods empolying hydroxypyrene.

However, as the semiconductor lithographic process has gradually developed to an ultra-finer process, it became difficult for the organic hardmask material to serve as a mask during an etching process due to its poor etching selectivity, as compared to a conventional inorganic hardmask material. Therefore, an organic hardmask material that is further optimized to the etching process has been urgently required.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a hardmask polymer having excellent polymer solubility, high etching selectivity and sufficient multi-etching resistance, and a composition containing the same.

The present invention has been made in an effort to provide a novel hardmask polymer capable of minimizing relectivity between a resist and an underlying layer to thereby be used to perform a lithographic technique, and a composition containing the same.

An exemplary embodiment of the present invention provides a hardmask composition containing: (a) an arylcarbazole derivative polymer represented by the following Chemical Formula 1 or a polymer blend containing the same; and (b) an organic solvent.

[Chemical Formula 1]

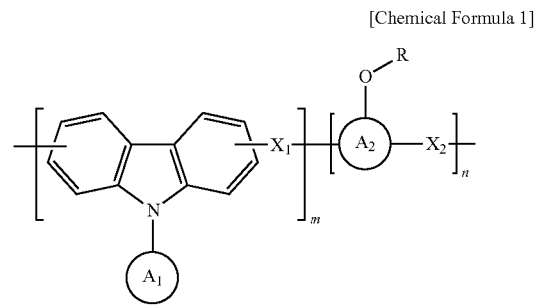

In Chemical Formula (1), $A_1$ and $A_2$ may each be independently a ($C_6$-$C_{40}$) aromatic aryl group and be the same as or different from each other, R is t-butyloxycarbonyl (t-BOC), ethoxyethyl, isopropyloxyethyl, or tetrahydropyranyl, $X_1$ and $X_2$ are each a polymerization linkage group derived from aldehyde or an aldehyde acetal monomer capable of being one-to-one polymerized with an arylcarbazole derivative and $A_2$ in the presence of an acid catalyst, m/(m+n) is in a range of 0.05 to 0.8, and a weight average molecular weight (Mw) of an entire copolymer is in a range of 1,000 to 30,000.

According to an embodiment of the present invention, the hardmask compositions based on the arylcarbazol based polymer according to the exemplary embodiments of the present invention have a rapid polymerization rate as compared to a phenol based polymer according to the related art.

The hardmask compositions based on the arylcarbazol based polymer according to the exemplary embodiments of the present invention have a high packing density, such that in the case of forming a thin film, a film density may be increased, and thus, an etching property may be significantly excellent. Therefore, the hardmask composition may have sufficient multi-etching resistance due to etching selectivity, such that a lithographic structure having excellent pattern evaluation result may be provided.

The hardmask compositions based on the arylcarbazol based polymer according to the exemplary embodiments of the present invention may have a reflective index and absorbance in ranges useful as an anti-reflective film in a deep UV region such as ArF (193 nm), KrF (248 nm), and the like, at the time of forming a film, such that the hardmask compositions may minimize reflectivity between a resist and an underlying layer.

DETAILED DESCRIPTION OF THE EMBODIMENTS

According to the present invention, there is provided an anti-reflective hardmask composition containing: (a) an arylcarbazole derivative polymer represented by the following Chemical Formula 1 or a polymer blend containing the same; and (b) an organic solvent.

[Chemical Formula 1]

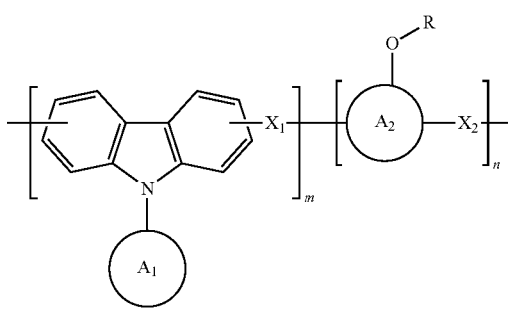

Here, in Chemical Formula 1, $A_1$ and $A_2$ may each be a $(C_6-C_{40})$ aromatic aryl group and be the same as or different from each other.

Preferably, $A_1$ and $A_2$ may each be any one aromatic aryl group selected from the following substituents.

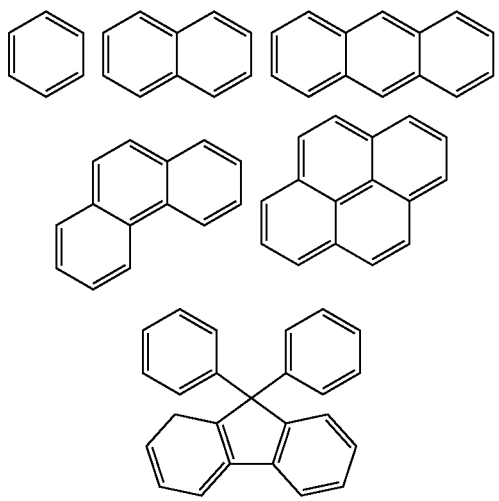

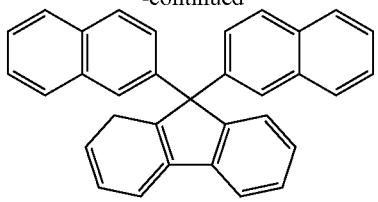

In addition, R may be a $(C_3-C_{20})$ alkyl group capable of being pyrolyzed at a temperature of 120 to 250 degrees. Preferably, R may be t-BOC, ethoxyethyl, isopropyloxyethyl, or tetrahydropyranyl.

Meanwhile, $X_1$ and $X_2$ may be the same as or different from each other and be each a polymerization linkage group derived from aldehyde or an aldehyde acetal monomer capable of being one-to-one polymerized with an arylcarbazole monomer and $A_2$ mainly in the presence of an acid catalyst. $X_1$ and $X_2$ each independently have the following structures. Mainly, $X_1$ and $X_2$ may be formed of aldehyde monomers such as paraformaldehyde, benzaldehyde, benzaldehyde dialkyl acetal, and the like, or monomers having a di-methoxy or di-ethoxy group, and may react with the carbazole derivative in the presence of the acid catalyst. Preferably, $X_1$ and $X_2$ may be any one of the following substituents.

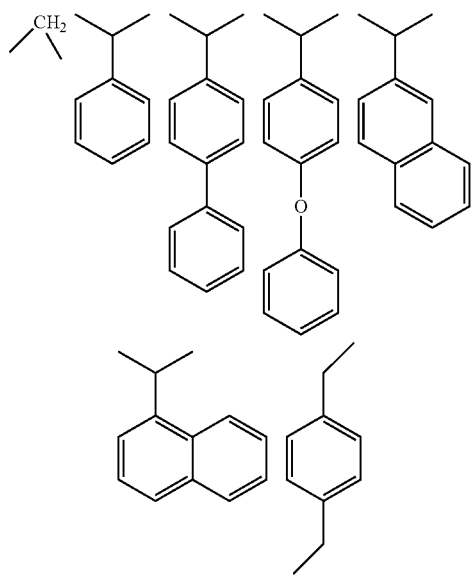

Here, $m/(m+n)$ may be in a range of 0.05 to 0.8, and a weight average molecular weight (Mw) of an entire copolymer may be in a range of 1,000 to 30,000, preferably, 2,000 to 5,000.

Meanwhile, in order to prepare the hardmask composition, it is preferable to use a carbazole based aromatic ring-containing polymer (a) in an amount of 1 to 30 parts by weight based on 100 parts by weight of the organic solvent (b).

In the case in which the amount of the carbazole based aromatic ring-containing polymer is less than 1 part by weight or more than 30 parts by weight, a coating thickness may become less than or more than a desired coating thickness, such that it is difficult to satisfy an accurate coating thickness.

In addition, the organic solvent is not particularly limited as long as it has sufficient solubility for the aromatic ring-containing polymer. Examples thereof may include propylene glycol monomethyl ether acetate (PGMEA), cyclohexanone, ethyl lactate, and the like.

Further, the anti-reflective hardmask composition according to the present invention may additionally contain (c) a cross-linker component; and (d) an acid catalyst.

Preferably, the cross-linker component (c) used in the hardmask composition according to the present invention may cross-link a repeating unit of a polymer by heating in a reaction catalyzed by generated acid, and the acid catalyst (d) may be an acid catalyst activated by heat.

The cross-linker component (c) used in the hardmask composition according to the present invention is not particular limited as long as it is a cross-linker capable of being reacted with a hydroxyl group of an aromatic ring containing polymer in a manner in which it is catalyzed by the generated acid. Specific examples thereof include an etherified amino resin, for example, a methylated or butylated melamine resin (specifically, a N-methoxymethyl-melamine resin or a N-butoxymethyl-melamine resin) and a methylated or butylated urea resin (specifically, Cymel U-65 Resin or UFR 80 Resin), a glycoluril compound (specifically, Powderlink 1174), or a bisepoxy compound (specifically, a 2,6-bis(hydroxymethyl)-p-cresol compound), and the like.

As the acid catalyst (d) used in the hardmask composition according to the present invention, an organic acid such as p-toluene sulfonic acid monohydrate may be used, and a compound such as a thermal acid generator (TAG) for storage stability may also be used. The TAG is an acid generating compound generating acid at the time of heat treatment, and for example, pyridinium p-toluene sulfonate, 2,4,4,6-tetrabromocyclohexadienone, benzoin tosylate, 2-nitrobenzyl tosylate, alkyl esters of organic sulfonic acid, and the like, may be preferably used.

In the case in which the cross-linker component (c) and the acid catalyst (d) are further contained in a final hardmask composition, the hardmask composition according to the present invention contains 1 to 30 wt %, more preferably, 3 to 15 wt % of a polymer prepared from an arylcarbazole derivative having a strong absorption property in a UV region or a polymer blend containing the same, 0.1 to 5 wt %, more preferably, 0.1 to 3 wt % of the cross-linker component (c), 0.001 to 0.05 wt %, more preferably 0.001 to 0.03 wt % of the acid catalyst (d), and the balance being the organic solvent, based on 100 wt % of the hardmask composition. Preferably, the organic solvent may be contained in an amount of 75 to 98 wt %.

Here, in the case in which an amount of the aromatic ring-containing polymer is less than 1 wt % or more than 30 wt %, a coating thickness may become less than or more than a desired coating thickness, such that it is difficult to satisfy an accurate coating thickness.

Further, in the case in which an amount of the cross-linker component is less than 0.1 wt %, cross-linking properties may not be exhibited, and in the case in which the amount of the cross-linker component is more than 5 wt %, optical properties of a coating film may be changed due to excessive addition.

In addition, when an amount of the acid catalyst is less than 0.001 wt %, crosslinking properties may not be appropriately exhibited, and when the amount of the acid catalyst is more than 0.05 wt %, acidity may be increased due to excessive addition, which may affect storage stability.

Hereinafter, the present invention will be described in more detail through the following Examples, but the following Examples are provided only in order to describe the present invention and are not used to limit the scope of the present invention.

Preparation Example 1

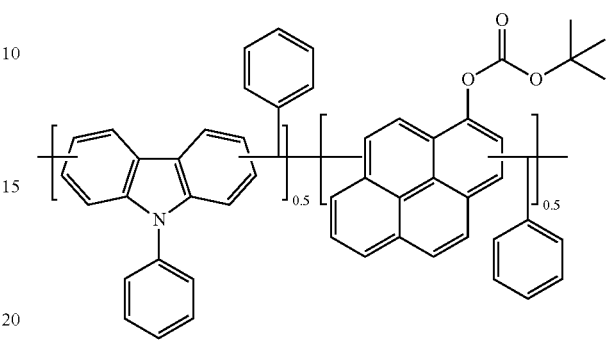

In a 250 mL round flask, 12 g (50 mmol) of 9-phenyl-carbazole, 12.7 g (120 mmol) of benzaldehyde, and 11 g (50 mmol) of 1-pyrenol were completely dissolved in 85 g of propylene glycol monomethyl ether acetate (PGMEA) at a temperature of 60 degrees, and then 1 g of an undiluted sulfuric acid solution was added thereto.

After a polymerization reaction was carried out for about 12 hours in a state in which a reaction temperature was maintained at about 120° C., a precipitate formed after dropping a reactant in an excess methanol/water (8:2) co-solvent was dissolved in an appropriate amount of a PGMEA solvent, and then re-precipitated using an excess ethanol/water (8:2) co-solvent.

A synthesized polymer was dissolved in an appropriate amount of tetrahydrofuran (THF) solvent, and an appropriate amount of triethylamine (TEA) was added thereto. Then, di-t-butyl dicarbonate was added thereto in a concentration of 20 to 100% of pyrenol (aromatic phenol) equivalent, and a reaction was carried out at a temperature of about 60 degrees for about 4 hours.

After the reaction was terminated, a reactant was precipitated in an excessive amount of water and then neutralized using ammonium chloride salt. A produced precipitate was filtered and dried in a vacuum oven at 50 degrees for about 20 hours, thereby obtaining a polymer having a weight average molecular weight (Mw) of 2,600.

Preparation Example 2

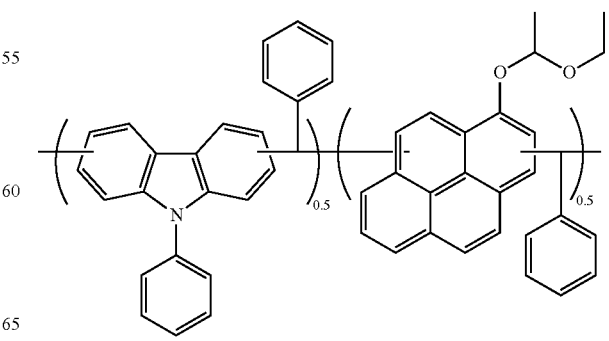

A polymer was synthesized using 12 g (50 mmol) of 9-phenylcarbazole, 12.7 g (120 mmol) of benzaldehyde, and 11 g (50 mmol) of 1-pyrenol in the same manner as in Preparation Example 1.

After the synthesized polymer was dissolved in an appropriate amount of tetrahydrofuran (THF) solvent, ethyl vinyl ether was added thereto in a concentration of 20 to 100% of pyrenol (aromatic phenol) equivalent. Then, a catalytic amount of p-toluene sulfonic acid was added thereto, and a reaction was carried out at room temperature for about 4 hours.

After the reaction was terminated, a reactant was precipitated in an excessive amount of water and then neutralized using triethylamine (TEA). A produced precipitate was filtered and dried in a vacuum oven at 50 degrees for about 20 hours, thereby obtaining a polymer having a weight average molecular weight (Mw) of 2,400.

Preparation Example 3

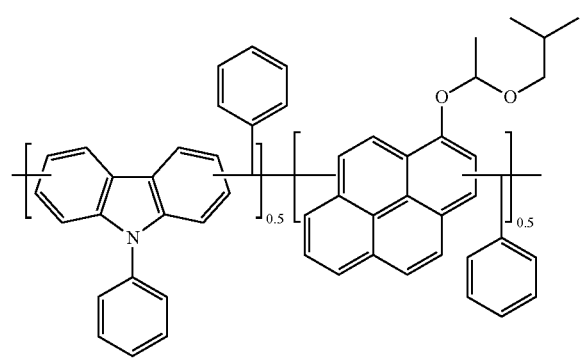

A polymer was synthesized using 12 g (50 mmol) of 9-phenylcarbazole, 12.7 g (120 mmol) of benzaldehyde and 11 g (50 mmol) of 1-pyrenol in the same manner as in Preparation Example 1.

After the synthesized polymer was dissolved in an appropriate amount of tetrahydrofuran (THF) solvent, isobutyl vinyl ether was added thereto in a concentration of 20 to 100% of pyrenol (aromatic phenol) equivalent, and then a polymer was synthesized in the same manner as in Preparation Example 2, thereby obtaining a polymer having a weight average molecular weight (Mw) of 2,500.

Preparation Example 4

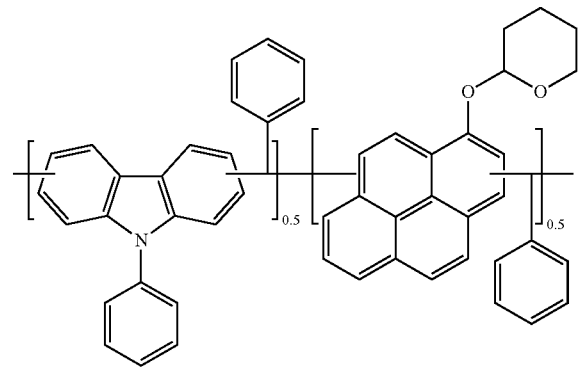

A polymer was synthesized using 12 g (50 mmol) of 9-phenylcarbazole, 12.7 g (120 mmol) of benzaldehyde and 11 g (50 mmol) of 1-pyrenol in the same manner as in Preparation Example 1.

After the synthesized polymer was reacted with 3,4-dihydro-2H-pyran in the same manner as in Preparation Example 2, a polymer was purified and dried in a vacuum oven, thereby obtaining a polymer having a weight average molecular weight (Mw) of 2,700.

Preparation Example 5

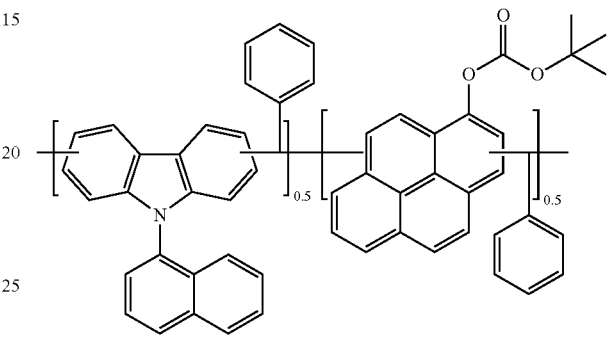

After 15 g (50 mmol) of 9-naphthylcarbazole, 12.7 g (120 mmol) of benzaldehyde, and 11 g (50 mmol) of 1-pyrenol were dissolved in 116 g of propylene glycol monomethyl ether acetate, 1 g of an undiluted sulfuric acid solution was added thereto.

After a polymerization was carried out in the same manner as in Preparation Example 1, and a polymer was purified and dried in a vacuum oven, thereby obtaining a polymer having a weight average molecular weight of 2,800.

Preparation Example 6

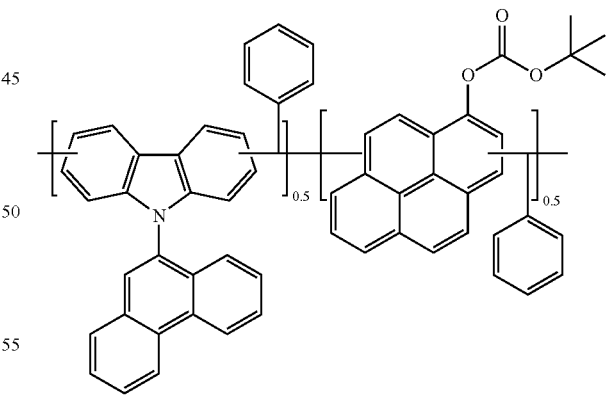

After 17.2 g (50 mmol) of 9-(9-phenanthryl)carbazole, 12.7 g (120 mmol) of benzaldehyde, and 11 g (50 mmol) of 1-pyrenol were dissolved in 122 g of propylene glycol monomethyl ether acetate, 1 g of an undiluted sulfuric acid solution was added thereto.

After a polymerization was carried out in the same manner as in Preparation Example 1, and a polymer was purified and dried in a vacuum oven, thereby obtaining a polymer having a weight average molecular weight of 2,700.

Preparation Example 7

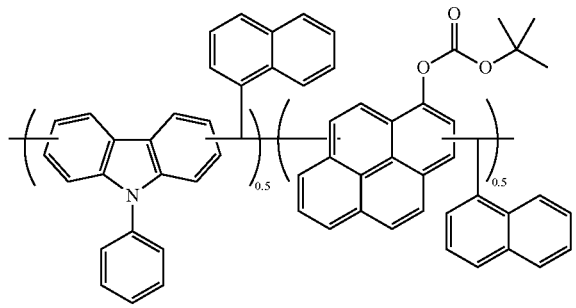

After a polymer was synthesized using 12 g (50 mmol) of 9-phenylcarbazole, 18.7 g (120 mmol) of 1-naphthaldehyde, and 11 g (50 mmol) of 1-pyrenol in the same manner as in Preparation Example 1, the polymer was purified and dried in a vacuum oven, thereby obtaining a polymer having a weight average molecular weight of 2,300.

Preparation Example 8

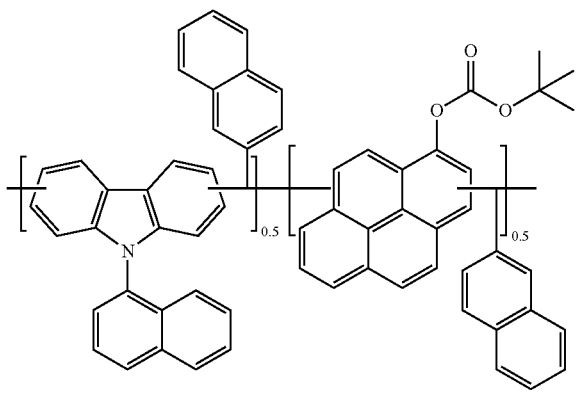

After a polymer was synthesized using 15 g (50 mmol) of 9-naphthylcarbazole, 18.7 g (120 mmol) of 2-naphthaldehyde, and 11 g (50 mmol) of 1-pyrenol in the same manner as in Preparation Example 1, the polymer was purified and dried in a vacuum oven, thereby obtaining a polymer having a weight average molecular weight of 2,400.

Preparation Example 9

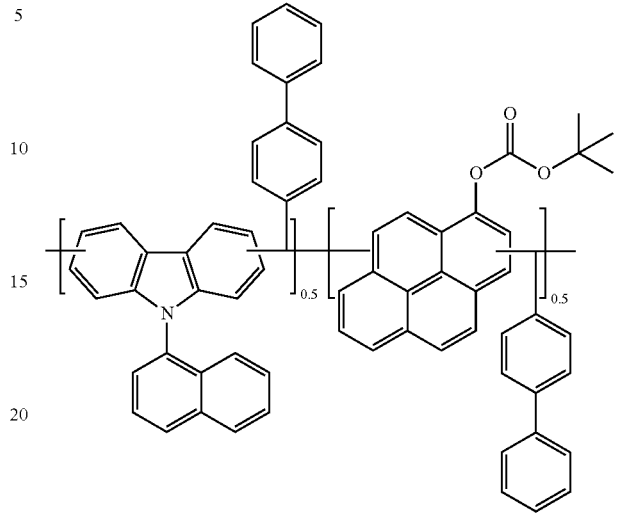

After a polymer was synthesized using 15 g (50 mmol) of 9-naphthylcarbazole, 21.8 g (120 mmol) of biphenylaldehyde, and 11 g (50 mmol) of 1-pyrenol in the same manner as in Preparation Example 1, the polymer was purified and dried in a vacuum oven, thereby obtaining a polymer having a weight average molecular weight of 2,500.

Preparation Example 10

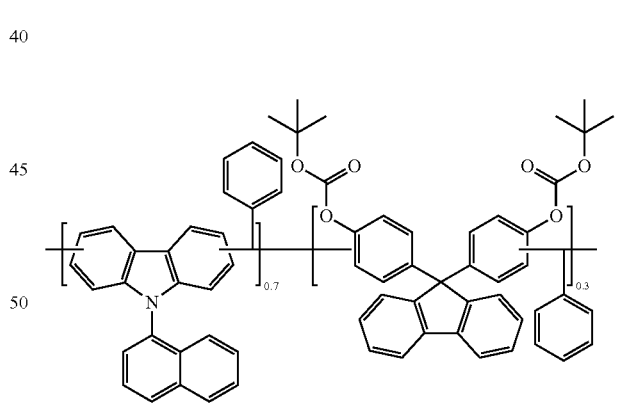

After a polymer was synthesized using 20.5 g (70 mmol) of 9-naphthylcarbazole, 12.7 g (120 mmol) benzaldehyde, and 10.5 g (30 mmol) of 9,9-bis(4-hydroxyphenyl)fluorene in the same manner as in Preparation Example 1, the polymer was purified and dried in a vacuum oven, thereby obtaining a polymer having a weight average molecular weight of 2,500.

Preparation Example 11

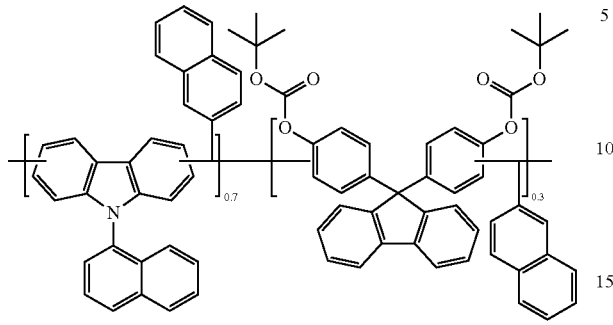

After a polymer was synthesized using 20.5 g (70 mmol) of 9-naphthylcarbazole, 18.7 g (120 mmol) of 2-naphthaldehyde, and 10.5 g (30 mmol) of 9,9-bis(4-hydroxyphenyl)fluorene in the same manner as in Preparation Example 1, the polymer was purified and dried in a vacuum oven, thereby obtaining a polymer having a weight average molecular weight of 2,600.

Preparation Example 12) Synthesis of Arylcarbazole Based Cyclic Polymer

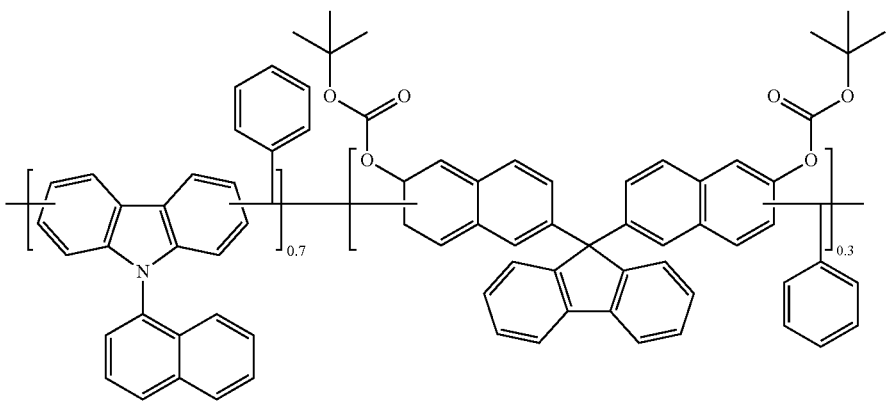

After a polymer was synthesized using 20.5 g (70 mmol) of 9-naphthylcarbazole, 12.7 g (120 mmol) benzaldehyde, and 13.5 g (30 mmol) of 9,9-bis(4-hydroxynaphthyl)fluorene in the same manner as in Preparation Example 1, the polymer was purified and dried in a vacuum oven, thereby obtaining a polymer having a weight average molecular weight of 2,900.

Comparative Preparation Example) Synthesis of Hydroxynaphthalene Polymer

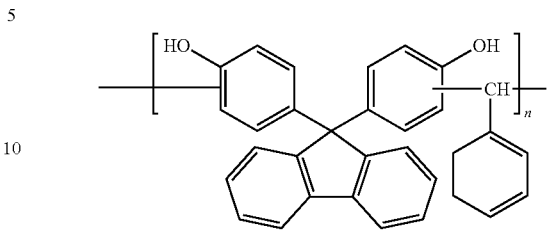

After 35 g (100 mmol) of 9,9-bis(4-hydroxyphenyl)fluorene and 12.7 g (120 mmol) of benzaldehyde were dissolved in 115 g of PGMEA, 1 g of concentrated sulfuric acid was added thereto.

After a polymerization was carried out in the same manner as in Preparation Example 1, and a polymer was purified and dried in a vacuum oven, thereby obtaining a polymer having a weight average molecular weight of 3,100.

[Preparation Examples 1-12 and Comparative Preparation Example]

Preparation of Hardmask Composition

After 0.9 g of each of the polymers prepared in Preparation Examples 1 to 12 and Comparative Preparation Example was weighed and dissolved together with 0.1 g of glycoluril compound crosslinker (Powderlink 1174) and 1 mg of pyridinium p-toluene sulfonate in 9 g of propylene glycol monomethyl ether acetate (PGMEA), followed by filtration, thereby preparing sample solutions of Preparation Examples 1 to 12 and Comparative Preparation Example.

Each of the sample solutions prepared in Preparation Examples 1 to 12 and Comparative Preparation Example was spin-coated on a silicon wafer and baked at 240° C. for 60 seconds, thereby forming a film having a thickness of 3,000 Å.

A refractive index n and an extinction coefficient k of each of the formed films were obtained, respectively. A used device was Ellipsometer (manufactured by J. A. Woollam) and measurement results were shown in Table 1.

As an evaluation result, it was confirmed that the films have refractive indices and absorbance enough to be used as an anti-reflective film at wavelengths of ArF (193 nm) and KrF (248 nm). Generally, a refractive index of a material used as a semiconductor anti-reflective film is in a range of about 1.4 to 1.8, and an extinction coefficient is important. The higher the extinction coefficient is, the better, and generally, when a k value is 0.3 or more, there is no problem in use a film as an anti-reflective film. Therefore, it may be appreciated that the hardmask compositions according to the embodiments of the present invention may be used as anti-reflective films.

TABLE 1

| Sample | Optical Properties (193 nm) | | Optical Properties (248 nm) | |
|---|---|---|---|---|
|  | Refractive Index (n) | Extinction Coefficient (k) | Refractive Index (n) | Extinction Coefficient (k) |
| Preparation Example 1 | 1.50 | 0.69 | 1.71 | 0.52 |
| Preparation Example 2 | 1.50 | 0.71 | 1.70 | 0.53 |
| Preparation Example 3 | 1.49 | 0.70 | 1.71 | 0.54 |
| Preparation Example 4 | 1.52 | 0.69 | 1.73 | 0.53 |
| Preparation Example 5 | 1.53 | 0.72 | 1.72 | 0.54 |
| Preparation Example 6 | 1.52 | 0.71 | 1.71 | 0.55 |
| Preparation Example 7 | 1.54 | 0.69 | 1.73 | 0.55 |
| Preparation Example 8 | 1.51 | 0.70 | 1.73 | 0.53 |
| Preparation Example 9 | 1.52 | 0.68 | 1.71 | 0.53 |
| Preparation Example 10 | 1.53 | 0.69 | 1.72 | 0.54 |
| Preparation Example 11 | 1.54 | 0.70 | 1.73 | 0.55 |
| Preparation Example 12 | 1.55 | 0.71 | 1.74 | 0.52 |
| Comparative Preparation Example | 1.48 | 0.68 | 1.95 | 0.35 |

Lithographic Evaluation of Anti-Reflective Hardmask Composition

Each of the sample solutions prepared in Preparation Examples 1, 6, 8, and 10 and Comparative Preparation Example was spin-coated on a silicon wafer coated with aluminum and baked at 240° C. for 60 seconds, thereby forming a coating film having a thickness of 3000 Å.

A photoresist for KrF was coated on each of the formed coating films and baked at 110° C. for 60 seconds and exposed to light using exposure equipment (XT: 1400, NA 0.93, manufactured by ASML), followed by development using a tetramethyl ammonium hydroxide aqueous solution (2.38 wt %) for 60 seconds. Next, as a result of observing a 90 nm line and space pattern thereof using V-SEM, the result shown in the following Table 2 was obtained. A exposure latitude (EL) margin depending on changes in exposure energy and a depth of focus (DoF) margin depending on changes in distance from a light source were measured and the measurement results are recorded in Table 2. As a pattern evaluation result, it may be appreciated that the patterns showed good results in terms of profiles and margins, and satisfied an EL margin and a DoF margin required in litho pattern evaluation.

TABLE 2

| Sample | Pattern Properties | | |
|---|---|---|---|
|  | EL Margin (ΔΔmJ/energy mJ) | DoF Margin (μm) | Pattern Shape |
| Preparation Example 1 | 0.4 | 0.4 | cubic |
| Preparation Example 6 | 0.3 | 0.3 | cubic |
| Preparation Example 8 | 0.4 | 0.3 | cubic |
| Preparation Example 10 | 0.4 | 0.4 | cubic |
| 비교 Preparation Example | 0.2 | 0.2 | undercut |

Evaluation of Etching Properties of Anti-reflective Hardmask Composition

Bottom SiON anti-reflective coating (BARC) films of specimens each patterned in Preparation Examples 1, 6, and 8 and Comparative Preparation Example were dry-etched by $CHF_3/CF_4$ mixed gas using PR as a mask, and subsequently, the respective hardmasks were dry-etched by $O_2/N_2$ mixed gas using the bottom SiON anti-reflective coating (BARC) film as a mask. Thereafter, a silicon nitride (SiN) film was dry-etched by $ChF_3/CF_3$ mixed gas using the hardmask as a mask, and the remaining hardmask and organic material were subjected to $O_2$ ashing and wet stripping processes.

Immediately after hardmask etching and silicon nitride etching, a cross section of each of the specimens was observed using V-SEM, and the results are shown in Table 3. As a result of etching, in each case, pattern shapes after hardmask etching and silicon nitride etching were good without a bowing phenomenon, such that it was confirmed that resistance against an etching process was sufficient, and an etching process of the silicon nitride film was satisfactorily performed.

TABLE 3

| Sample | Pattern Shape (After Hardmask Etching) | Pattern Shape (After SiN Etching) |
|---|---|---|
| Preparation Example 1 | Vertical Shape | Vertical 비교 |
| Preparation Example 6 | Vertical Shape | Vertical Shape |
| Preparation Example 8 | Vertical Shape | Vertical Shape |
| Comparative Preparation Example | Slightly Bowing Shape | Slightly Bowing Shape |

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

What is claimed is:

1. An anti-reflective hardmask composition comprising:
   (a) an arylcarbazole derivative polymer represented by the following Chemical Formula 1 or a polymer blend containing the same; and (b) an organic solvent,

[Chemical Formula 1]

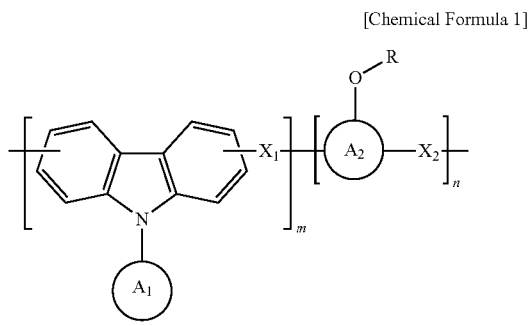

in Chemical Formula 1, $A_1$ and $A_2$ are each independently a ($C_6$-$C_{40}$) aromatic aryl group and are the same as or different from each other, R is t-butyloxycarbonyl (t-BOC), ethoxyethyl, isopropyloxyethyl, or tetrahydropyranyl, $X_1$ and $X_2$ are each a polymerization linkage group derived from aldehyde or an aldehyde acetal monomer capable of being one-to-one polymerized with an arylcarbazole derivative and $A_2$ in the presence of an acid catalyst, m/(m+n) is in a range of 0.05 to 0.8, and a weight average molecular weight (Mw) of polymer is in a range of 1,000 to 30,000.

2. The anti-reflective hardmask composition of claim 1, wherein:

$A_1$ and $A_2$ are each any one selected from the following sububstituents

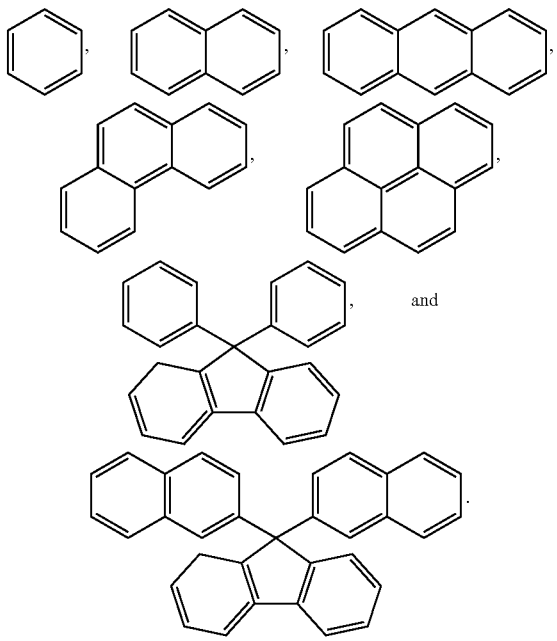

3. The anti-reflective hardmask composition of claim 2, wherein:

$A_1$ is a phenyl, biphenyl, naphthyl, anthracenyl, phenanthrenyl, or pyrenyl group, and $A_2$ is a naphthyl, pyrenyl, diphenylfluorene, or dinaphthylfluorene group.

4. The anti-reflective hardmask composition of claim 2, wherein $X_1$ or $X_2$ is a benzaldehyde, naphthylaldehyde, or biphenylaldehyde group.

5. The anti-reflective hardmask composition of claim 2, further comprising a crosslinker component and an acid catalyst.

6. The anti-reflective hardmask composition of claim 5, it comprises
(a) 1 to 30 wt % of the arycarbazole derivative polymer or the polymer blend containing the same;
(b) 0.1 to 5 wt % of the crosslinker component;
(c) 0.001 to 0.05 wt % of the acid catalyst; and
(d) the balance being the organic solvent, based on 100 wt % of the hardmask composition.

7. The anti-reflective hardmask composition of claim 6, wherein:
the crosslinker component is any one selected from the group consisting of a melamine resin, an amino resin, a glycoluril compound, and a bisepox compound.

8. The anti-reflective hardmask composition of claim 6, wherein:
the acid catalyst is selected from the group consisting of p-toluenesulfonic acid monohydrate, pyridinium p-toluene sulfonate, 2,4,4,6-tetrabromocyclohexadieneone, benzoin tosylate, 2-nitrobenzyl tosylate, and alkyl esters of organic sulfonic acid.

9. The anti-reflective hardmask composition of claim 1, wherein:
$A_1$ is a phenyl, biphenyl, naphthyl, anthracenyl, phenanthrenyl, or pyrenyl group, and $A_2$ is a naphthyl, pyrenyl, diphenylfluorene, or dinaphthylfluorene group.

10. The anti-reflective hardmask composition of claim 1, wherein $X_1$ or $X_2$ is a benzaldehyde, naphthylaldehyde, or biphenylaldehyde group.

11. The anti-reflective hardmask composition of claim 1, further comprising a crosslinker component and an acid catalyst.

12. The anti-reflective hardmask composition of claim 11, it comprises
(a) 1 to 30 wt % of the arycarbazole derivative polymer or the polymer blend containing the same;
(b) 0.1 to 5 wt % of the crosslinker component;
(c) 0.001 to 0.05 wt % of the acid catalyst; and
(d) the balance being the organic solvent, based on 100 wt % of the hardmask composition.

13. The anti-reflective hardmask composition of claim 12, wherein:
the crosslinker component is any one selected from the group consisting of a melamine resin, an amino resin, a glycoluril compound, and a bisepox compound.

14. The anti-reflective hardmask composition of claim 12, wherein:
the acid catalyst is selected from the group consisting of p-toluenesulfonic acid monohydrate, pyridinium p-toluene sulfonate, 2,4,4,6-tetrabromocyclohexadieneone, benzoin tosylate, 2-nitrobenzyl tosylate, and alkyl esters of organic sulfonic acid.

* * * * *